United States Patent
Joseph et al.

(10) Patent No.: US 7,932,541 B2
(45) Date of Patent: Apr. 26, 2011

(54) HIGH PERFORMANCE COLLECTOR-UP BIPOLAR TRANSISTOR

(75) Inventors: Alvin J. Joseph, Williston, VT (US); Andreas D. Stricker, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 471 days.

(21) Appl. No.: 12/013,790

(22) Filed: Jan. 14, 2008

(65) Prior Publication Data

US 2009/0179228 A1   Jul. 16, 2009

(51) Int. Cl.
  *H01L 27/082* (2006.01)
(52) U.S. Cl. ......... 257/198; 438/202; 257/577; 257/591
(58) Field of Classification Search .................. 257/183, 257/200, 552; 438/369, 315, 312
See application file for complete search history.

(56) References Cited

U.S. PATENT DOCUMENTS

| | | | |
|---|---|---|---|
| 5,118,634 A * | 6/1992 | Neudeck et al. | 438/341 |
| 5,315,151 A * | 5/1994 | Hsieh et al. | 257/592 |
| 6,239,477 B1 * | 5/2001 | Johnson | 257/592 |
| 6,329,259 B1 | 12/2001 | Johansson | |
| 6,518,111 B1 * | 2/2003 | Johnson | 438/202 |
| 7,001,819 B2 | 2/2006 | Mochizuki et al. | |
| 7,285,857 B2 * | 10/2007 | Kwak et al. | 257/745 |
| 2005/0079678 A1 * | 4/2005 | Verma et al. | 438/312 |
| 2006/0220064 A1 | 10/2006 | Joodaki et al. | |
| 2008/0173870 A1 * | 7/2008 | Kim et al. | 257/59 |
| 2008/0173898 A1 * | 7/2008 | Ohmaki | 257/194 |

OTHER PUBLICATIONS

Chu, et al., "High Speed, Collector Up Silicon Heterojunction Bipolar Transistor Structure," TDB, vol. 34, No. 7A, Dec. 1991, pp. 266-270.
Van den Oever, et al., "Epitaxy and Device Behaviour of Collector-Up SiGe HBTs with a Partial P-Type Collector," Solid-State Electronics, vol. 45, No. 11, Nov. 2001, pp. 1899-1904.
Gruhle, et al., "Collector-Up SiGe Heterojunction Bipolar Transistor," IEEE Transactions on Electron Devices, vol. 46, No. 7, Jul. 1999, pp. 1510-1513.
Subbanna, "New Process for Highly Integrated Bipolar Circuits," TDB, vol. 34, No. 10B, Mar. 1992, pp. 65-69.

* cited by examiner

*Primary Examiner* — Steven Loke
*Assistant Examiner* — David Goodwin
(74) *Attorney, Agent, or Firm* — Gibb I.P. Law Firm, LLC; Anthony J. Canale

(57) ABSTRACT

Disclosed are embodiments of a hetero-junction bipolar transistor (HBT) structure and method of forming the structure that provides substantially lower collector-to-base parasitic capacitance and collector resistance, while also lowering or maintaining base-to-emitter capacitance, emitter resistance and base resistance in order to achieve frequency capabilities in the THz range. The HBT is a collector-up HBT in which a dielectric layer and optional sidewall spacers separate the raised extrinsic base and the collector so as to reduce collector-to-base capacitance. A lower portion of the collector is single crystalline semiconductor so as to reduce collector resistance. The raised extrinsic base and the intrinsic base are stacked single crystalline epitaxial layers, where link-up is automatic and self-aligned, so as to reduce base resistance. The emitter is a heavily doped region below the top surface of a single crystalline semiconductor substrate so as to reduce emitter resistance.

19 Claims, 14 Drawing Sheets

HIGH PERFORMANCE COLLECTOR-UP BIPOLAR TRANSISTOR

BACKGROUND

1. Field of the Invention

The embodiments of the invention generally relate to silicon germanium (SiGe) heterojunction bipolar transistors (HBTs) and, more particularly, to a collector-up SiGe HBT having frequency capabilities in the terahertz (THz) range and a method of forming the HBT structure.

2. Description of the Related Art

Currently, silicon germanium (SiGe) hetero-junction bipolar transistors (HBTs) have frequency capabilities in the gigahertz (GHz) range. However, traditional SiGe HBT structures and methods of forming those structures must be rethought in order to achieve frequency capabilities in the terahertz (THz) range. Specifically, in order to achieve frequency capabilities in the THz range, collector-to-base parasitic capacitance and collector resistance must be substantially lowered. Previously, collector-up SiGe HBT structures were developed in an attempt to achieve such higher frequency capabilities. However, these collector-up SiGe HBT structures were not effective as they were unable to maintain or lower base-to-emitter capacitance, were unable to lower or maintain emitter resistance and/or were unable to maintain or lower base resistance or, more specifically, were unable to lower resistance in the link between intrinsic and extrinsic base regions. Thus, there is a need in the art for a new THz capable SiGe HBT structure and method of forming such a structure. More particularly, there is a need in the art for a new collector-up SiGe HBT structure and method that provides substantially lower collector-to-base parasitic capacitance and collector resistance, while also lowering or maintaining base-to-emitter capacitance, emitter resistance and base resistance in order to achieve frequency capabilities in the THz range.

SUMMARY

In view of the foregoing, disclosed herein are embodiments of a hetero-junction bipolar transistor (HBT) structure and method of forming the structure that provides substantially lower collector-to-base parasitic capacitance and collector resistance, while also lowering or maintaining base-to-emitter capacitance, emitter resistance and base resistance in order to achieve frequency capabilities in the THz range. Specifically, the disclosed HBT is a collector-up HBT in which a dielectric layer and optional sidewall spacers separate the raised extrinsic base and the collector so as to reduce collector-to-base capacitance. At least a lower portion of the collector is formed as a single crystalline structure so as to reduce collector resistance. The raised extrinsic base and the intrinsic base are formed as stacked single crystalline epitaxial layers, where link-up is automatic and self-aligned, so as to reduce base resistance. The emitter is formed as a heavily doped region of a single crystalline semiconductor substrate so as to reduce emitter resistance and is further formed below the top surface of the substrate (with an optional SIMOX layer separating the emitter from the extrinsic base layer) in order to reduce base-to-emitter capacitance. Finally, the disclosed HBT structure can include one or more optional appropriately doped link-up regions (i.e., reach-through regions), including but not limited to, emitter-to-emitter contact link-up regions, an emitter-to-intrinsic base link-up region, an intrinsic base-to-collector link-up region, and extrinsic base-to-base contact link-up regions.

More specifically, disclosed herein are embodiments of a collector-up HBT structure. The HBT structure comprises a substrate comprising a single crystalline semiconductor material. This single crystalline semiconductor material can be part of a bulk or silicon on insulator wafer. An emitter region can be positioned within the substrate such that it too comprises a single crystalline semiconductor material. This emitter region can be implanted/doped with a relatively high concentration of a first type dopant and can be positioned a predetermined distance below the top surface of the substrate.

The HBT structure can further comprise an extrinsic base layer on the top surface of the substrate. The extrinsic base layer can comprise an epitaxial single crystalline semiconductor material that is in-situ doped with a relatively high concentration of second type dopant. Additionally, a first trench can extend vertically through the extrinsic base layer to the substrate. An intrinsic base layer can be positioned on the extrinsic base layer and on the substrate within the first trench. The intrinsic base layer can also comprise an epitaxial single crystalline semiconductor material.

An optional emitter-to-intrinsic base link-up region can be positioned in the substrate extending vertically between the emitter region and the first trench. This emitter-to-intrinsic base link-up region can be implanted with a first type dopant so as to ensure an electrical connection between the emitter region in the substrate and the intrinsic base layer. The concentration of the first type dopant may be less than that in the emitter region and, optionally, can be graded. An optional separation by implantation of oxygen (SIMOX) layer can also be positioned within the substrate between the extrinsic base layer and the emitter region to further minimize base-to-emitter capacitance. It should be understood that this SIMOX layer would not extend below the first trench.

The HBT structure can further comprise a dielectric layer on the intrinsic base layer. A second trench can be aligned above the first trench and can extend vertically through the dielectric layer to the intrinsic base layer. A collector layer, comprising an epitaxial semiconductor layer in-situ doped with a relatively high concentration of a first type dopant, can be positioned on the dielectric layer and within the trenches. Specifically, a lower portion of the collector layer can be positioned within the first trench adjacent to the intrinsic base layer and can comprise an epitaxial single crystalline semiconductor material. A mid-portion of the collector layer can be positioned within the second trench adjacent the dielectric layer and can comprise an epitaxial semiconductor material. An upper portion of the collector layer can be positioned on top of the dielectric layer outside the second trench and can comprise an epitaxial polycrystalline semiconductor material. Optionally, sidewall spacers can be positioned in the first and second trenches between the intrinsic base layer and the collector layer. Furthermore, an optional intrinsic base-to-collector link-up region can be positioned in a portion of the intrinsic base layer within the first trench. This intrinsic base-to-collector link-up region can be implanted with a first type dopant so as to ensure the electrical connection between the intrinsic base layer and collector layer. The concentration of the first type dopant in the intrinsic base-to-collector link-up region may be less than that in the collector region and, optionally, can be graded.

The HBT structure can also comprise contacts and contact link-up regions. Specifically, the emitter region in the substrate can extend laterally beyond the extrinsic base layer and the intrinsic base layer so as to provide landing spots on the substrate for emitter contacts. Furthermore, the intrinsic and extrinsic base layers can extend laterally beyond the dielectric layer and upper portion of the collector layer so as to provide landing spots on the intrinsic base layer for base contacts.

The emitter contacts can be positioned on the substrate above the outer edges of the emitter regions and, more specifically, positioned laterally adjacent to the extrinsic and intrinsic base layers. Optional emitter-to-emitter contact link-up regions can be positioned within the substrate such that they extend vertically from the emitter contacts to the outer edges of the emitter region. These emitter-to-emitter contact regions can be implanted with a first type dopant. Sidewall spacers can further be positioned on the substrate adjacent to the extrinsic and intrinsic base layers so that the emitter contacts and the emitter-to-emitter contact link-up regions are isolated from the extrinsic base layer.

The base contacts can be positioned on the outer edges of the intrinsic base layer and, more specifically, positioned laterally adjacent to the dielectric layer and the upper portion of the collector layer. Optional extrinsic base-to-base contact link-up regions can be positioned in the outer edges of the intrinsic base layer such that they extend between the outer edges of the extrinsic base layer and the base contacts. These extrinsic base-to-base contact link-up regions can be implanted with the second type dopant and can extend into the extrinsic base layer at the outer edges.

Also disclosed herein are embodiments of a method of forming the above-described HBT. Specifically, the method embodiments comprise providing a single crystalline semiconductor substrate having a top surface. A single crystalline emitter region is formed within the substrate such that the emitter region is below the top surface of the substrate by a predetermined distance and further such that it is heavily doped with a first type dopant.

Next, a single crystalline extrinsic base layer can be formed on the substrate such that the extrinsic base layer is doped with a relatively high concentration of a second type dopant. For example, the extrinsic base layer can be formed by performing an eptiaxial deposition process during which the extrinsic base layer is in-situ doped with the second type dopant. After the extrinsic base layer is formed, a first trench can be formed through the extrinsic base layer to the substrate.

Optionally, either just before or just after the first trench is formed in the extrinsic base layer a separation by implantation of oxygen (SIMOX) layer can be formed in the substrate between the extrinsic base layer and the emitter region. The process of forming the SIMOX layer should include a masking step to ensure that that the resulting SIMOX layer is not positioned below the first trench. Also, optionally, once the first trench is formed and before an intrinsic base layer is subsequently formed, the extrinsic base layer a first type dopant can be selectively implanted through the bottom surface of the trench into the substrate so as to form a self-aligned emitter-to-intrinsic base link-up region in the substrate extending vertically between the emitter region and the first trench.

Then, a single crystalline intrinsic base layer can be formed on the extrinsic base layer and on the substrate in the first trench (e.g., by performing a low temperature epitaxial deposition process). Next, a dielectric layer can be formed on the intrinsic base layer. A second trench can be formed through the dielectric layer to the intrinsic base layer such that the second trench is aligned above the first trench. Optionally, after the second trench is formed and before a collector layer is subsequently formed, sidewall spacers can be formed in the first and second trenches covering the intrinsic base layer such that, after the collector layer is subsequently formed, it is isolated from the base layers. Also, optionally, after the second trench is formed and before a collector layer is subsequently formed, a first type dopant can be selectively implanted into an exposed portion of the intrinsic base layer within the first trench so as to form an intrinsic base-to-collector link-up region. The concentration of the first type dopant in this intrinsic base can be less than that in the subsequently formed collector and can optionally be graded.

Next, a collector layer is formed with a single crystalline lower portion on the intrinsic base layer in the first trench, with a mid-portion on the lower portion adjacent to the dielectric layer within the second trench, and with a polycrystalline upper portion on top of the dielectric layer outside the second trench. The collector layer is further formed such that it is heavily doped with a first type dopant. To accomplish this, an epitaxial deposition process can be performed in which an epitaxial polycrystalline semiconductor material is deposited onto the dielectric layer and an epitaxial single crystalline semiconductor material is deposited onto the exposed intrinsic base layer within the trenches. During this epitaxial deposition process, the collector layer can be in-situ doped with the first type dopant.

Once the collector layer is formed, the various layers discussed-above can be lithographically patterned and etched to expose landing spots for contacts. That is, the upper portion of the collector layer and the dielectric layer can be lithographically patterned and etched such that the outer edges of the intrinsic and extrinsic base layers extend laterally beyond the upper portion of the collector layer and the dielectric layer so as to provide landing spots on the intrinsic base layer for base contacts. Furthermore, the intrinsic and extrinsic base layers can be lithographically patterned and etched such that outer edges of the emitter region within the substrate extend laterally beyond the base layers so as to provide landing spots on the substrate for emitter contacts.

Before contacts are formed on the appropriate landing spots, optional contact link-up regions can also be formed. For example, a masked implantation process can be used to implant a first type dopant into exposed portions of the substrate in order to form emitter-to-emitter contact link-up regions that extend vertically from the top surface of the substrate to the outer edges of the emitter region. It should be noted that this masked implantation process can be performed either before extrinsic base layer formation or after emitter contact landing spots on the substrate are exposed. A masked implantation process can also be used to implant a second type dopant into the outer edges of the intrinsic base layer in order to form extrinsic base-to-base contact link-up regions that extend vertically through the outer edges of the intrinsic base layer to the outer edges of the extrinsic base layer. It should be noted that this implantation process can further be used to increase the dopant concentration within the outer edges of the extrinsic base layer. Optionally, after the intrinsic and extrinsic base layers are lithographically patterned and etched, sidewall spacers can be formed on the substrate adjacent to the intrinsic and extrinsic base layers. Then, additional known process steps can be performed in order to complete the HBT structure.

These and other aspects of the embodiments of the invention will be better appreciated and understood when considered in conjunction with the following description and the accompanying drawings. It should be understood, however, that the following descriptions, while indicating embodiments of the invention and numerous specific details thereof, are given by way of illustration and not of limitation. Many changes and modifications may be made within the scope of these embodiments without departing from the spirit thereof, and the embodiments include all such changes and modifications.

BRIEF DESCRIPTION OF THE DRAWINGS

The embodiments of the invention will be better understood from the following detailed description with reference to the drawings, in which.

DETAILED DESCRIPTION OF EMBODIMENTS

Figure 1:
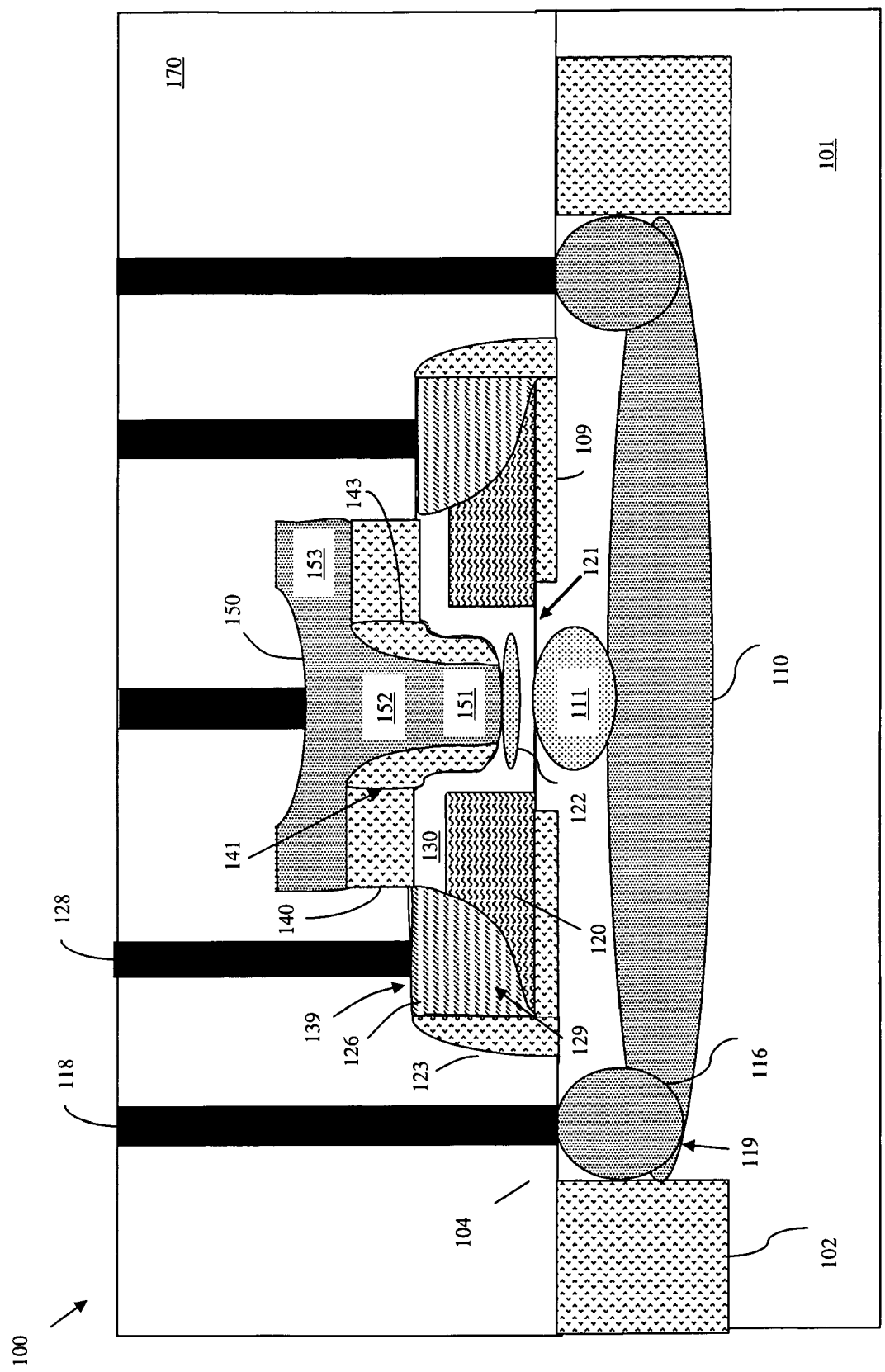
FIG. 1 is a cross-section diagram illustrating an embodiment of an HBT structure of the invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, silicon germanium (SiGe) hetero-junction bipolar transistors (HBTs) currently have frequency capabilities in the gigahertz (GHz) range. However, traditional SiGe HBT structures and methods of forming those structures must be rethought in order to achieve frequency capabilities in the terahertz (THz) range. Specifically, in order to achieve frequency capabilities in the THz range, collector-to-base parasitic capacitance and collector resistance must be substantially lowered. Previously, collector-up SiGe HBT structures were developed in an attempt to achieve such higher frequency capabilities. However, these collector-up SiGe HBT structures were not effective as they were unable to maintain or lower base-to-emitter capacitance, were unable to lower or maintain emitter resistance and/or were unable to maintain or lower base resistance or, more specifically, were unable to lower resistance in the link between intrinsic and extrinsic base regions. Thus, there is a need in the art for a new THz capable SiGe HBT structure and method of forming such a structure. More particularly, there is a need in the art for a new collector-up SiGe HBT structure and method that provides substantially lower collector-to-base parasitic capacitance and collector resistance, while also lowering or maintaining base-to-emitter capacitance, emitter resistance and base resistance in order to achieve frequency capabilities in the THz range.

In view of the foregoing, disclosed herein are embodiments of a hetero-junction bipolar transistor (HBT) structure and method of forming the structure that provides substantially lower collector-to-base parasitic capacitance and collector resistance, while also lowering or maintaining base-to-emitter capacitance, emitter resistance and base resistance in order to achieve frequency capabilities in the THz range. Specifically, the disclosed HBT is a collector-up HBT in which a dielectric layer and optional sidewall spacers separate the raised extrinsic base and the collector so as to reduce collector-to-base capacitance. At least a lower portion of the collector is formed as a single crystalline structure so as to reduce collector resistance. The raised extrinsic base and the intrinsic base are formed as stacked single crystalline epitaxial layers, where link-up is automatic and self-aligned, so as to reduce base resistance. The emitter is formed as a heavily doped region of a single crystalline semiconductor substrate so as to reduce emitter resistance and is further formed below the top surface of the substrate (with an optional SIMOX layer separating the emitter from the extrinsic base layer) in order to reduce base-to-emitter capacitance. Finally, the disclosed HBT structure can include one or more optional appropriately doped link-up (i.e., reach-through) regions, including but not limited to, emitter-to-emitter contact link-up regions, an emitter-to-intrinsic base link-up region, an intrinsic base-to-collector link-up region, and extrinsic base-to-base contact link-up regions.

More specifically, referring to FIG. 1, disclosed herein are embodiments of a collector-up HBT structure 100. For illustration purposes, the HBT structure 100 of the present invention will be described herein as an NPN transistor, having an N-type emitter, a P-type base and an N-type collector. However, it should be understood that the structure 100 could contrarily comprise a PNP transistor with opposite doping types.

The HBT structure 100 comprises a substrate 101 comprising a single crystalline semiconductor material. For example, the substrate 101 can comprise a bulk silicon wafer or a silicon-on-insulator (SOI) wafer. Trench isolation regions 102 can define the boundaries of the HBT 100 within the substrate 101.

An emitter region 110 can be positioned within the substrate 101 between the trench isolation regions 102. The emitter region 110 can also comprise a single crystalline semiconductor material. Specifically, this emitter region 110 can comprise an in-situ doped epitaxial semiconductor layer or an implanted region of the substrate. Whether in-situ doped or implanted, the emitter region 110 can have a relatively high concentration of a first type dopant so as to minimize emitter resistance. The first type dopant can, for example, comprise one or more N-type dopants, such as, phosphorous (P), arsenic (As), antimony (Sb), etc. Additionally, the emitter region 110 can be positioned a predetermined distance below the top surface 104 of the substrate 101 (e.g., implanted to a predetermined depth within the substrate or positioned below non-doped epitaxial semiconductor layers, depending upon the formation technique used, see discussion below), thereby minimizing base-to-emitter capacitance.

The HBT structure 100 can further comprise a raised extrinsic base layer 120 on the top surface 104 of the substrate 101. The raised extrinsic base layer 120 can comprise an epitaxial single crystalline semiconductor material that is in-situ doped with a relatively high concentration of second type dopant. For example, the raised extrinsic base layer 120 can comprise an approximately 500-1000 Å epitaxial silicon layer that is in-situ doped with a P-type dopant (e.g., boron (B)) at concentration ranging between $1 \times 10^{20}$ and $1 \times 10^{21}$ atoms/cm$^3$. The raised extrinsic base layer 120 can further be in-situ doped with carbon (C) so as to limit boron out-diffusion and, thereby minimize emitter-to-base capacitance. A first trench 121 can extend vertically through the extrinsic base layer 120 to the substrate 101 such that the extrinsic base layer 120 comprises two discrete sections on opposite sides of the first trench 121.

An intrinsic base layer 130 can be positioned on the extrinsic base layer 120 and on the substrate 101 within the first trench 121 (i.e., on the bottom surface of the first trench 121). The intrinsic base layer 130 can comprise an epitaxial single crystalline semiconductor material. For example, the intrinsic base layer 130 can comprise an approximately 300-400 Å epitaxial silicon material. Alternatively, the intrinsic base layer 130 can comprise an approximately 300-400 Å epitaxial silicon germanium (SiGe) material, wherein the Ge/Si ratio, doping profile and film thickness are optimized to reduce emitter to collector transit time. It should be noted that since both the extrinsic base layer 120 and intrinsic base layer 130 comprise single crystalline semiconductor materials and since they are stacked such that they are in direct contact across sidewalls of the extrinsic base layer 120 within the first trench 121 and across the top surface of the extrinsic base layer 120, the link-up between them is self-aligned and automatic. Consequently, base resistance is significantly minimized over prior art SiGe HBTs and, more particularly, prior art collector-up SiGe HBTs having polysilicon extrinsic base regions and non-self aligned base link-ups.

An optional emitter-to-intrinsic base link-up region 111 (i.e., reach-through region) can be positioned in the substrate 101 extending vertically between the emitter region 110 and the first trench 121. This emitter-to-intrinsic base link-up region 111 can be selectively implanted (e.g., through the first trench 121) with a first type dopant (e.g., one or more N-type dopants, such as, phosphorous (P), arsenic (As), antimony (Sb), etc.) so as to ensure an electrical connection between the emitter region 110 in the substrate 101 and the intrinsic base layer 130. Those skilled in the art will recognize that emitter resistance is a function of the first dopant concentration in both the emitter region 110 and the emitter-to-intrinsic base link-up region 111. However, the concentration of the first type dopant may be less than that in the emitter region 110 and, optionally, can be graded so as to minimize base-to-emitter capacitance. Additionally, those skilled in the art will recognize that base-to-emitter capacitance is dependent on dopant out-diffusion from the base and emitter regions. Thus, an optional separation by implantation of oxygen (SIMOX) layer 109 can also be positioned in the substrate 101 between the extrinsic base layer 120 and the emitter region 110 to limit diffusion of dopants and, thereby to further minimize this base-to-emitter capacitance. It should be understood that this SIMOX layer 109 would not extend laterally so that it is below the first trench 121.

The HBT structure 100 can further comprise a dielectric layer 140 on the intrinsic base layer 130. This dielectric layer 140 can comprise, for example, an oxide layer, a nitride layer or an oxide-nitride stack. A second trench 141 can extend vertically through the dielectric layer 140 to the intrinsic base layer 130 such that the dielectric layer 140 comprises two discrete sections on opposite sides of the second trench 141. Specifically, this second trench 141 can be aligned above the first trench 121 in the extrinsic base layer 120.

The HBT structure 100 can also comprise a collector layer 150 comprising an epitaxial semiconductor layer in-situ doped with a relatively high concentration of a first type dopant (e.g., one or more N-type dopants, such as, phosphorous (P), arsenic (As), antimony (Sb), etc.). Specifically, a lower portion 151 of the collector layer 150 can be positioned within the first trench 121 adjacent to the intrinsic base layer 130 and can comprise an epitaxial single crystalline semiconductor material (e.g., epitaxial silicon), thereby minimizing collector resistance. A mid-portion 152 of the collector layer 150 can be positioned within the second trench 141 adjacent the dielectric layer 140 and can comprise an epitaxial semiconductor material. An upper portion 153 of the collector layer 150 can be positioned on top of the dielectric layer 140 outside the second trench 141 and can comprise an epitaxial polycrystalline semiconductor material (e.g., epitaxial polysilicon).

Optionally, dielectric sidewall spacers 143 (e.g., oxide or nitride sidewall spacers) can be positioned within the first and second trenches 121-141 between the intrinsic base layer 130 and the collector layer 150 in order to isolate the collector layer 150 from the extrinsic base layer 120 and, thereby minimize collector-to-base capacitance. Furthermore, an optional intrinsic base-to-collector link-up region 122 can be positioned in a portion of the intrinsic base layer 120 within the first trench 121. This intrinsic base-to-collector link-up region 122 can be selectively implanted (e.g., through the second trench 141) with a first type dopant (e.g., one or more N-type dopants, such as, phosphorous (P), arsenic (As), antimony (Sb), etc.) so as to ensure the electrical connection between the intrinsic base layer 120 and collector layer 150. However, the concentration of the first type dopant may be less than that in the collector layer 150 and, optionally, can be graded so as to minimize collector-to-base capacitance.

The HBT structure 100 can also comprise contacts and contact link-up regions to the various components of the HBT. Specifically, the emitter region 110 in the substrate 101 can extend laterally beyond the extrinsic base layer 120 and the intrinsic base layer 130 so as to provide landing spots for the emitter contacts 118. Furthermore, the intrinsic and extrinsic base layers 120/130 can extend laterally beyond the dielectric layer 140 and upper portion 153 of the collector layer 150 so as to provide landing spots for the base contacts 128.

The emitter contacts 118 can be positioned on the substrate 101 above the outer edges 119 of the emitter region 110 and, more specifically, positioned laterally adjacent to the extrinsic and intrinsic base layers 120/130. Optional emitter-to-emitter contact link-up regions 116 (i.e., reach-through regions) can be positioned within the substrate 101 such that they extend vertically from the emitter contacts 118 to the outer edges 119 of the emitter region 110. These emitter-to-emitter contact link-up regions 116 can be implanted with a first type dopant (e.g., one or more N-type dopants, such as, phosphorous (P), arsenic (As), antimony (Sb), etc.). Additional dielectric sidewall spacers 123 can also be positioned on the substrate 101 adjacent to the extrinsic and intrinsic base layers 120/130 so that the emitter contacts 118 and the emitter-to-emitter contact link-up regions 116 are isolated from the extrinsic base layer 130, thereby further minimizing base-to-emitter capacitance.

The base contacts 128 can be positioned on the outer edges 129 of the intrinsic base layer 130 and, more specifically, positioned laterally adjacent to the dielectric layer 140 and the upper portion 153 of the collector layer 150. Optional extrinsic base-to-base contact link-up regions 126 (i.e., reach-through regions) can be positioned within the outer edges 139 of the intrinsic base layer 130 such that they extend between the outer edges 129 of the extrinsic base layer 120 and the base contact 128. These extrinsic base-to-base contact link-up regions 126 can be implanted with the second type dopant (e.g., a P-type dopant, such as, boron (B)) and can extend into the extrinsic base layer 120 at the outer edges 129 so as to further minimize base resistance.

Figure 2:
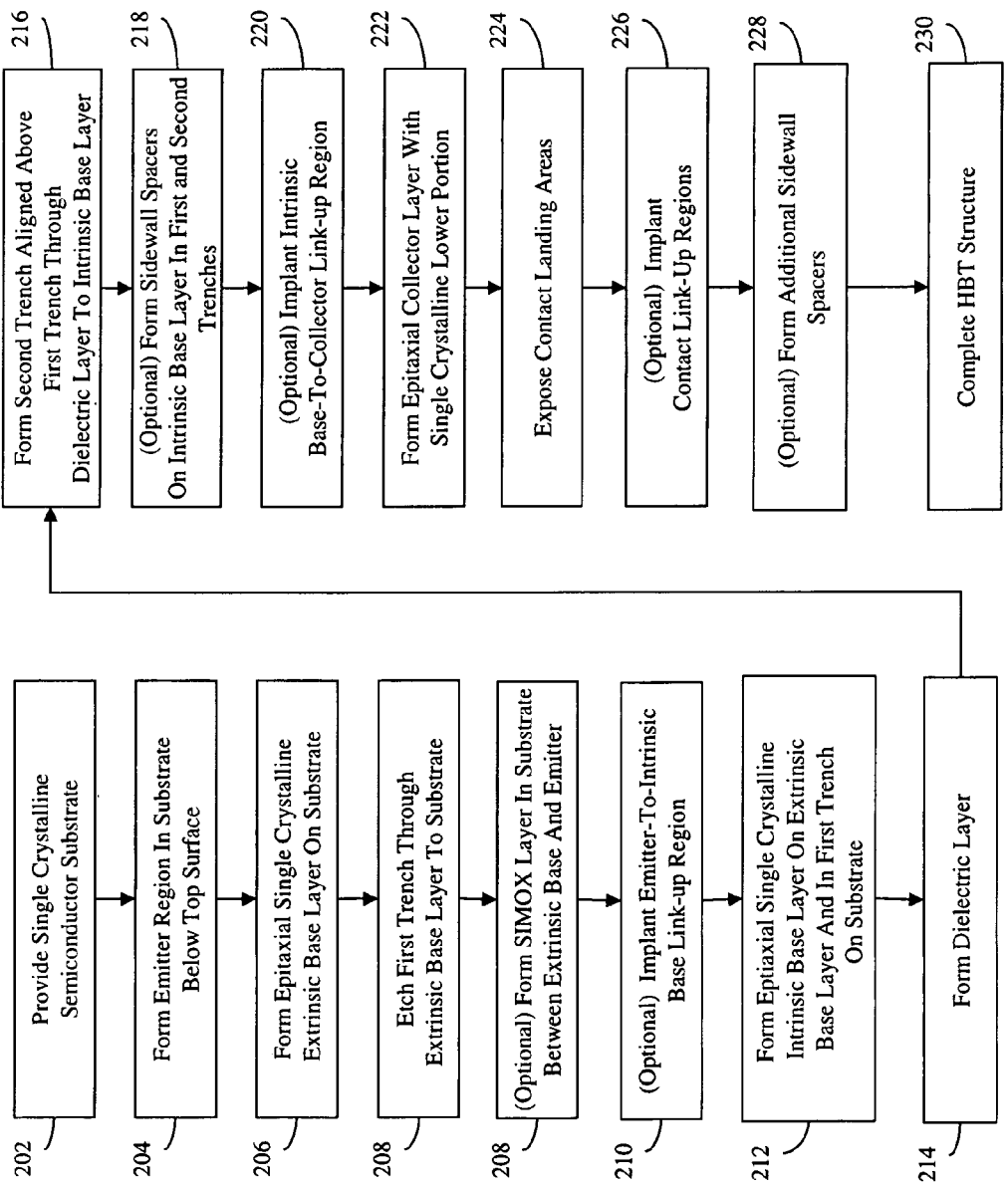
FIG. 2 is a flow diagram illustrating an embodiment of a method of forming the structure of FIG. 1.
Figure 3:
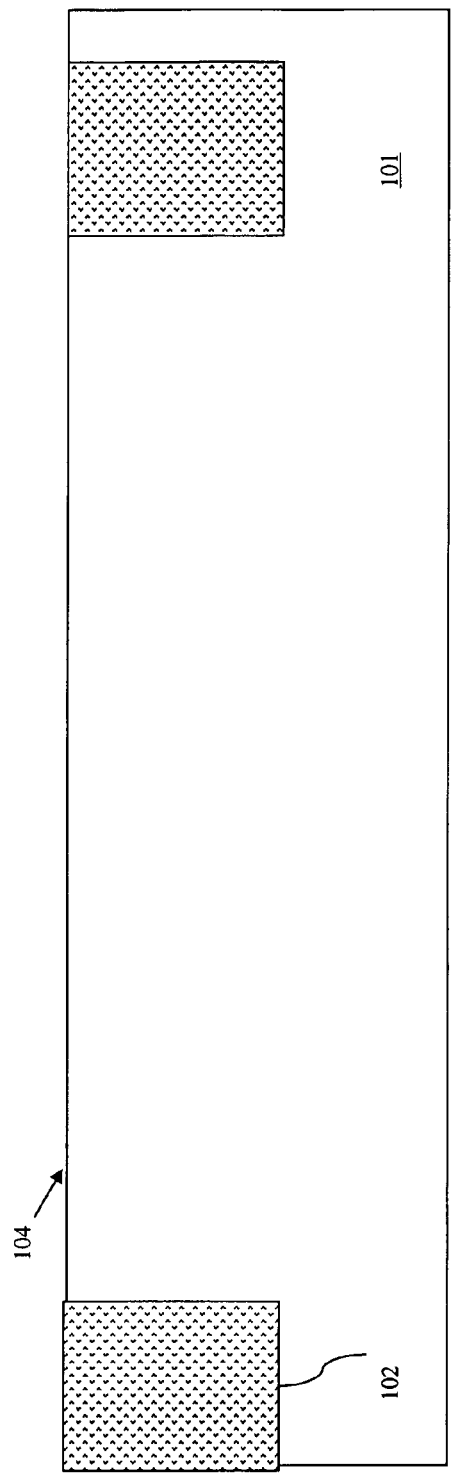
FIG. 3 is a cross-section diagram illustrating a partially completed HBT structure.

Also disclosed herein are embodiments of a method of forming the above-described HBT 100 of FIG. 1. Specifically, referring to the flow diagram of FIG. 2, the method embodiments comprise providing a single crystalline semiconductor substrate having a top surface (202). For example, the substrate 101 can comprise a bulk silicon wafer or a silicon-on-insulator (SOI) wafer. Then, using conventional processing techniques, trench isolation regions 102 formed in the substrate 101 so as to define the boundaries of the HBT structure (202, see FIG. 3).

Figure 4:
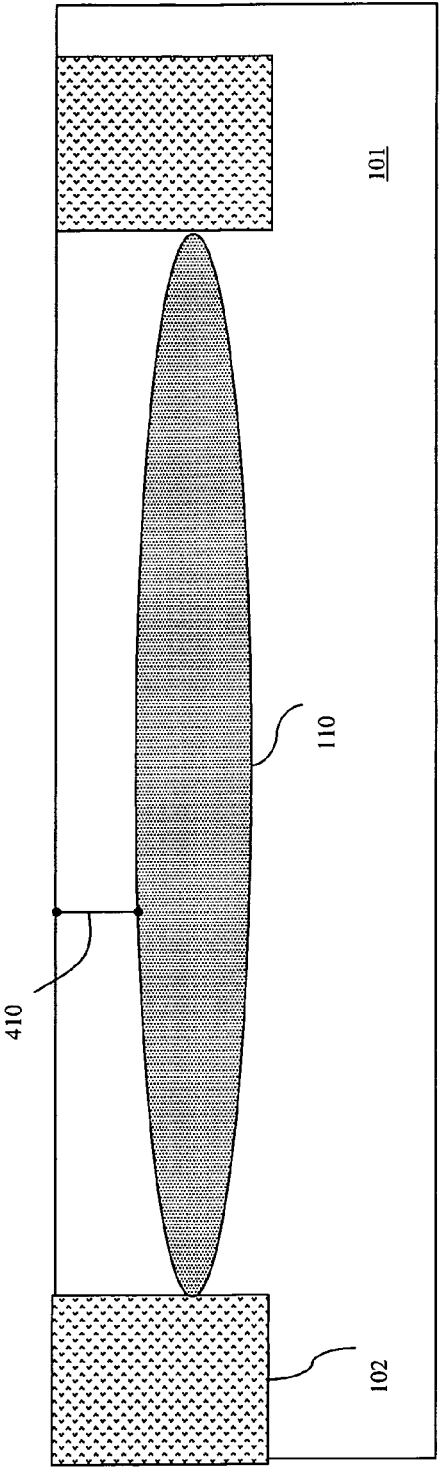
FIG. 4 is a cross-section diagram illustrating a partially completed HBT structure.

Then, a single crystalline emitter region 110 is formed within the substrate 101 (204, see FIG. 4). Specifically, using known implantation techniques, a relatively high concentration of a first type dopant (e.g., one or more N-type dopants, such as, phosphorous (P), arsenic (As), antimony (Sb), etc.) can be implanted the substrate 101 a predetermined distance 410 below the top surface 104 to form N+ region 110. Alternatively, the substrate 101 between the trench isolation regions 102 can comprise eptiaxially deposited silicon. During the eptiaxial deposition process, the region 110 below the top surface 104 can be in-situ doped with a relatively high concentration of the first type dopant (e.g., one or more N-type dopants, such as, phosphorous (P), arsenic (As), antimony (Sb), etc.). The doping concentration can be predetermined so as to minimize emitter resistance and the distance 410 can be predetermined so as to minimize emitter-to-base capacitance.

Figure 5:
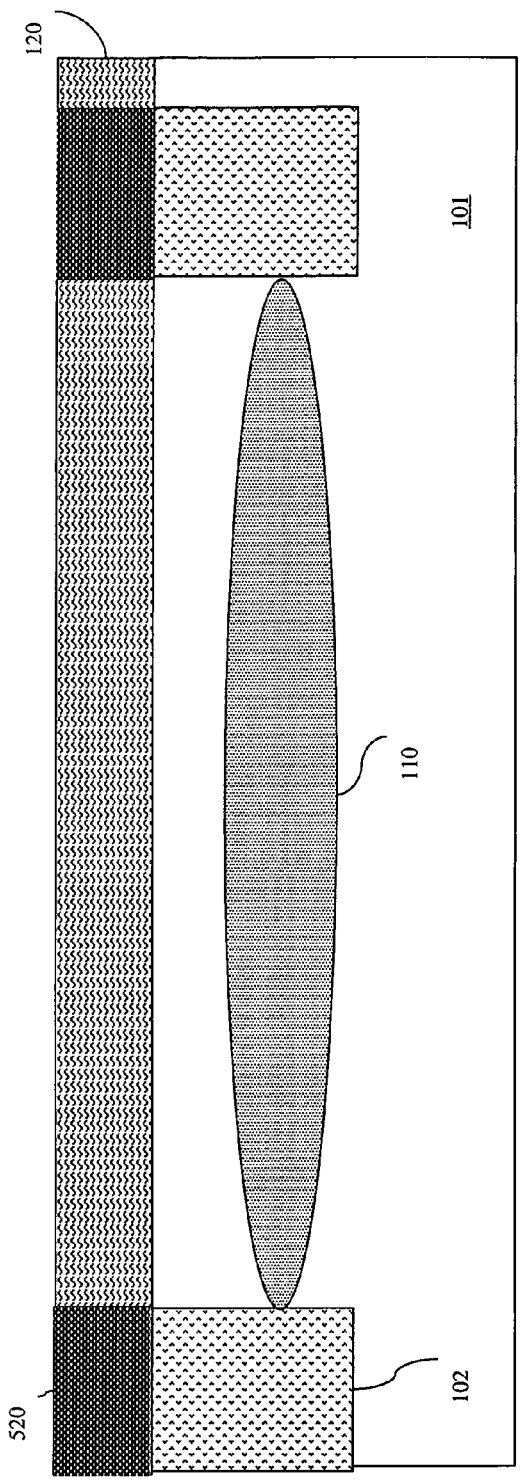
FIG. 5 is a cross-section diagram illustrating a partially completed HBT structure.

Next, a single crystalline raised extrinsic base layer 120 can be formed on the top surface 104 of the substrate 101 such that the extrinsic base layer is doped with a relatively high concentration of a second type dopant (206, see FIG. 5). The extrinsic base layer 120 can be formed by performing a conventional eptiaxial deposition process such that a single crystalline semiconductor layer (e.g., a silicon layer) is formed on the top surface 104 of the silicon substrate 101. It should be noted that this epitaxial deposition process will result in polycrystalline portions 520 being formed above the trench isolation regions 102. However, these polysilicon portions 520 will subsequently be etched away at process 224 (see discussion below), when forming the landing areas for the emitter contacts. This eptiaxial layer 120 can be formed to a thickness of approximately 500-1000 Å and can be in-situ doped with a relatively high concentration of a second type dopant (e.g., boron (B)) at concentration ranging between $1 \times 10^{20}$ and $1 \times 10^{21}$ atoms/cm$^3$). This raised extrinsic base layer 120 can further be in-situ doped with carbon (C) so as to limit boron out-diffusion and, thereby minimize emitter-to-base capacitance.

Figure 6:
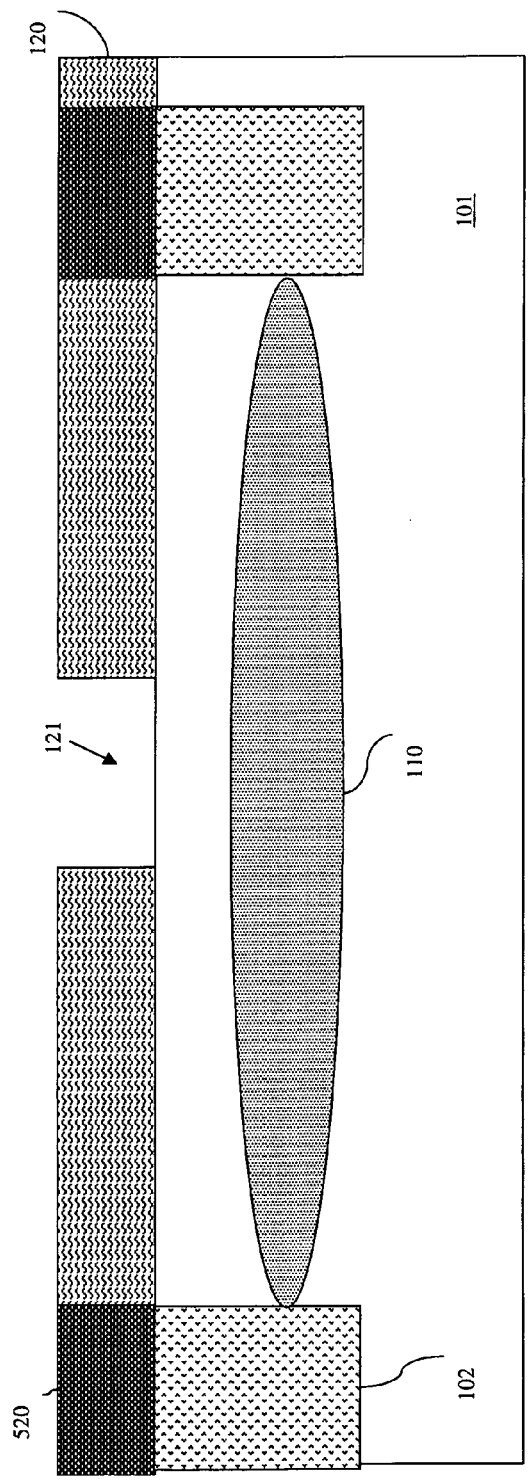
FIG. 6 is a cross-section diagram illustrating a partially completed HBT structure.

After the extrinsic base layer 120 is formed, a first trench 121 can be formed (e.g., lithographically patterned and etched) through the extrinsic base layer 120 to the substrate such that it is aligned above (e.g., approximately centered over) the emitter region 110 (208, see FIG. 6).

Figure 7:
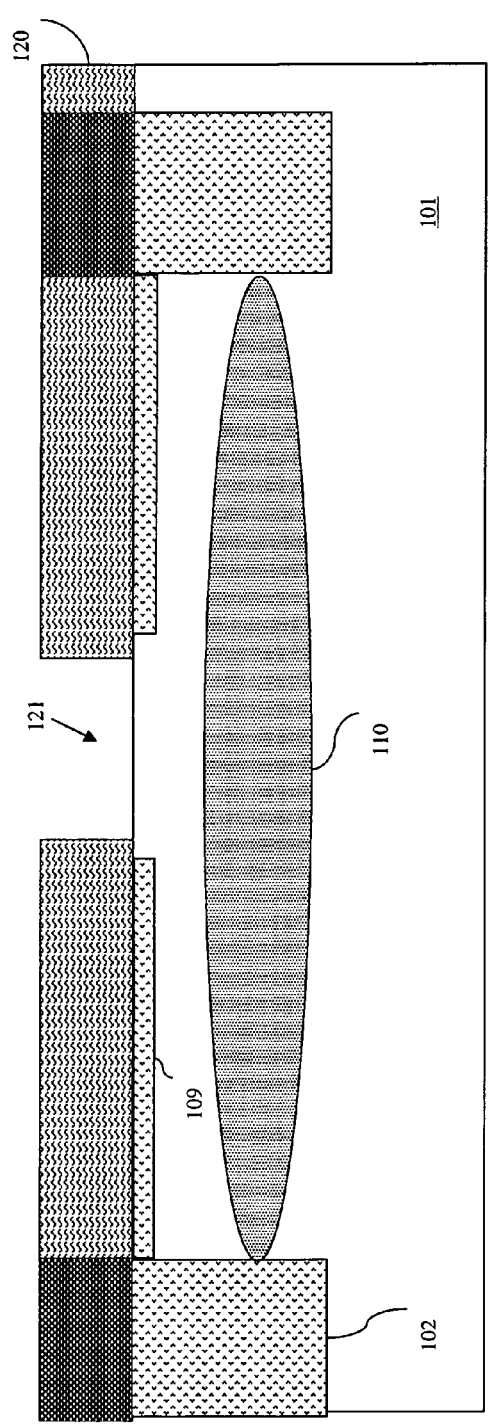
FIG. 7 is a cross-section diagram illustrating a partially completed HBT structure.
Figure 8:
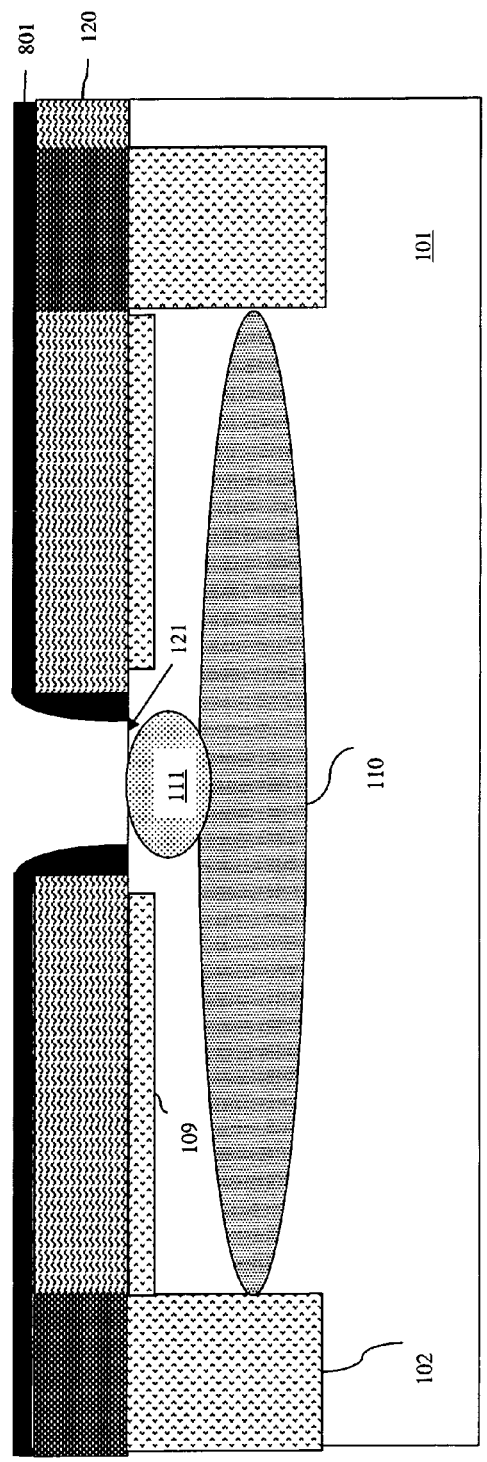
FIG. 8 is a cross-section diagram illustrating a partially completed HBT structure.

Optionally, either just before or just after the first trench 121 is formed in the extrinsic base layer 120, a separation by implantation of oxygen (SIMOX) layer 109 can be formed in the substrate 101 between the extrinsic base layer 120 and the emitter region 110 (210, see FIG. 7). The SIMOX layer 109 can be formed using conventional SIMOX techniques and should include a masking step to ensure that that the resulting SIMOX layer 109 is not positioned below the first trench 121. Also, optionally, once the first trench 121 is formed and before an intrinsic base layer 130 is subsequently formed, an emitter-to-intrinsic base link-up region 111 can be formed (210, see FIG. 8). Specifically, the extrinsic base layer 120 can be masked (see mask 801) such that only the substrate 101 at the bottom surface of the trench 121 is exposed. Then, a first type dopant (e.g., one or more N-type dopants, such as, phosphorous (P), arsenic (As), antimony (Sb), etc.) can be implanted through the exposed bottom surface of the trench 121 into the substrate 101 so as to form a self-aligned emitter-to-intrinsic base link-up region 111 in the substrate extending vertically between the emitter region 110 and the first trench 121. This link-up region 111 ensures an electrical connection between the emitter region 110 in the substrate 101 and a subsequently formed intrinsic base layer. Emitter resistance is a function of the first dopant concentration in both the emitter region 110 and in this emitter-to-intrinsic base link-up region 111. However, the first type dopant may be implanted into region 111 so that the dopant concentration is less than that in the emitter region 110 and, optionally, so that it is graded in order to minimize base-to-emitter capacitance.

Figure 9:
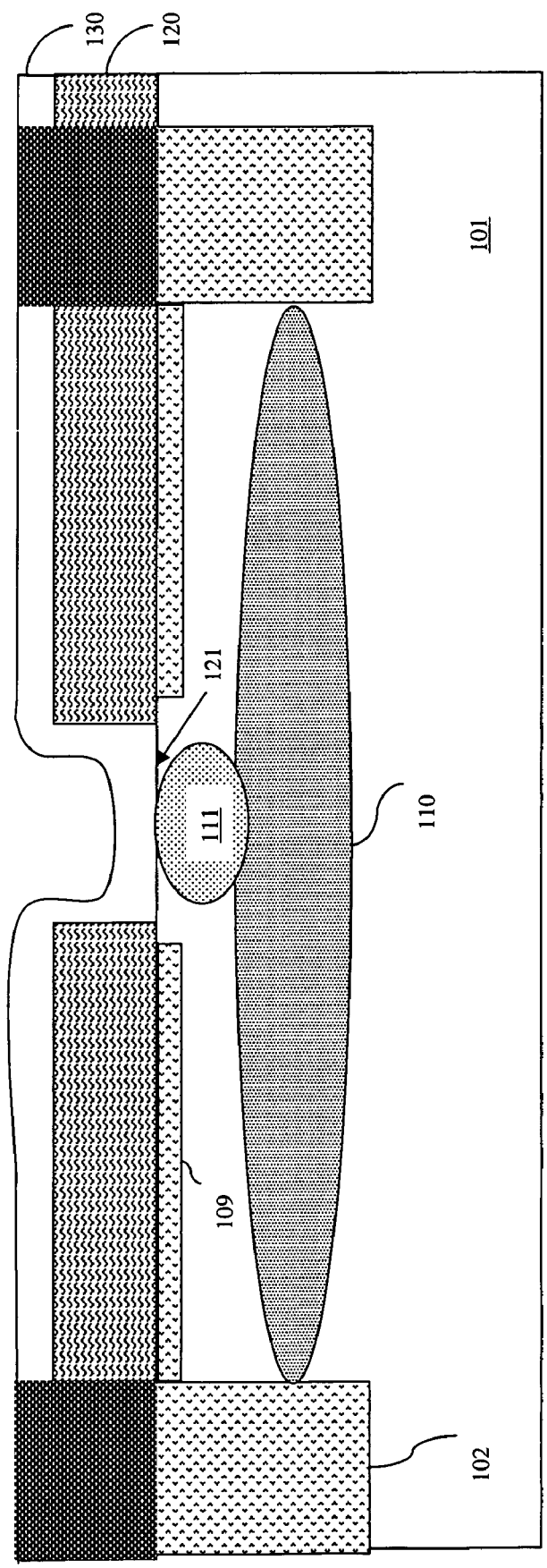
FIG. 9 is a cross-section diagram illustrating a partially completed HBT structure.

Then, a single crystalline intrinsic base layer 130 can be formed on the extrinsic base layer 120 and on the substrate 101 in the first trench 121 (212, see FIG. 9). Specifically, a low temperature epitaxial deposition process (LTE) can be used to form an approximately 300-400 Å epitaxial silicon layer on the extrinsic base layer 120 and on the substrate 101 in the first trench 121. Alternatively, an LTE process can be used to form an approximately 300-400 Å epitaxial silicon germanium (SiGe) material, wherein the Ge/Si ratio, doping profile and film thickness are optimized to reduce emitter to collector transit time. Since both the extrinsic base layer 120 and intrinsic base layer 130 are formed with single crystalline semiconductor materials and since they are stacked such that they are in direct contact across sidewalls of the extrinsic base layer 120 within the first trench 121 and across the top surface of the extrinsic base layer 120, the link-up between them is self-aligned and automatic. Consequently, base resistance is minimized. It should be noted that this epitaxial deposition process will result in polycrystalline portions 920 being formed above the polysilicon portions 520 of the extrinsic base layer 120. However, these polysilicon portions 920 will subsequently be etched away at process 224 (see discussion below), when forming the landing areas for the emitter contacts.

Figure 10:
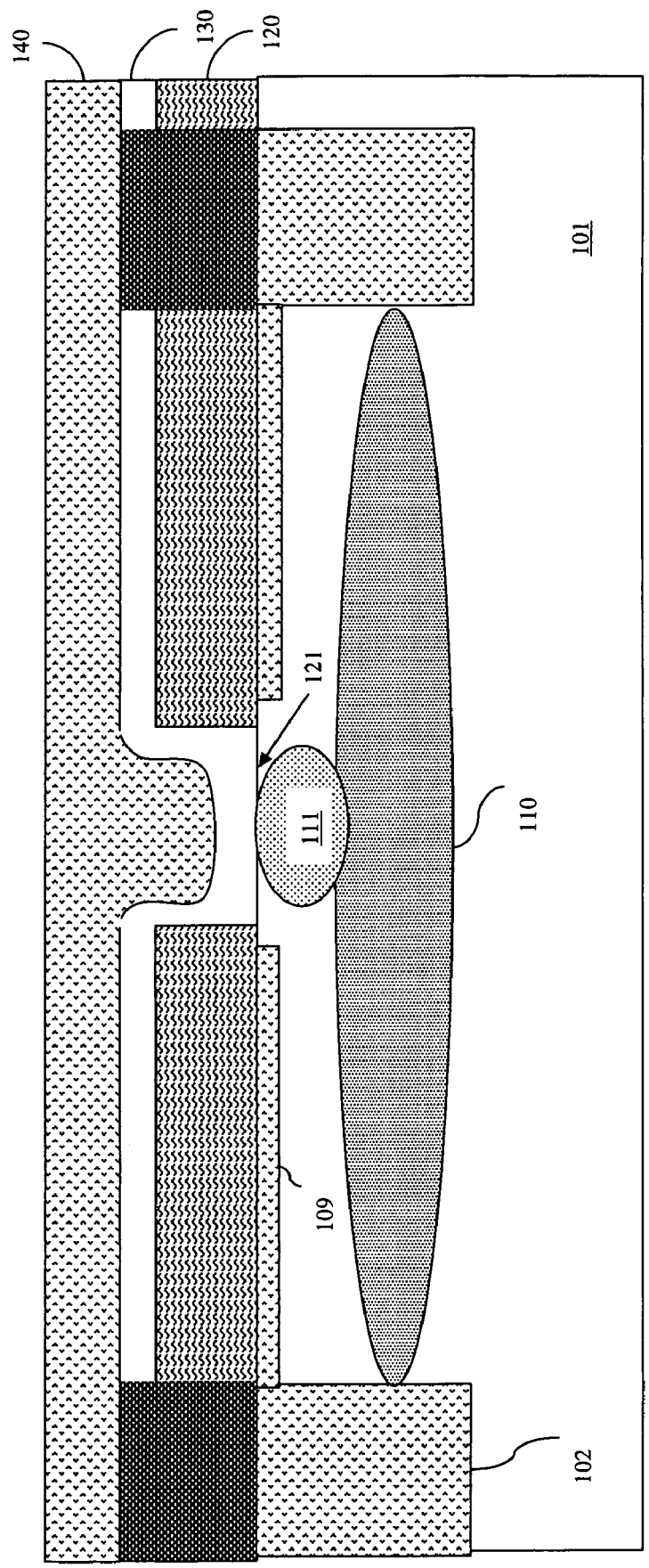
FIG. 10 is a cross-section diagram illustrating a partially completed HBT structure.
Figure 11:
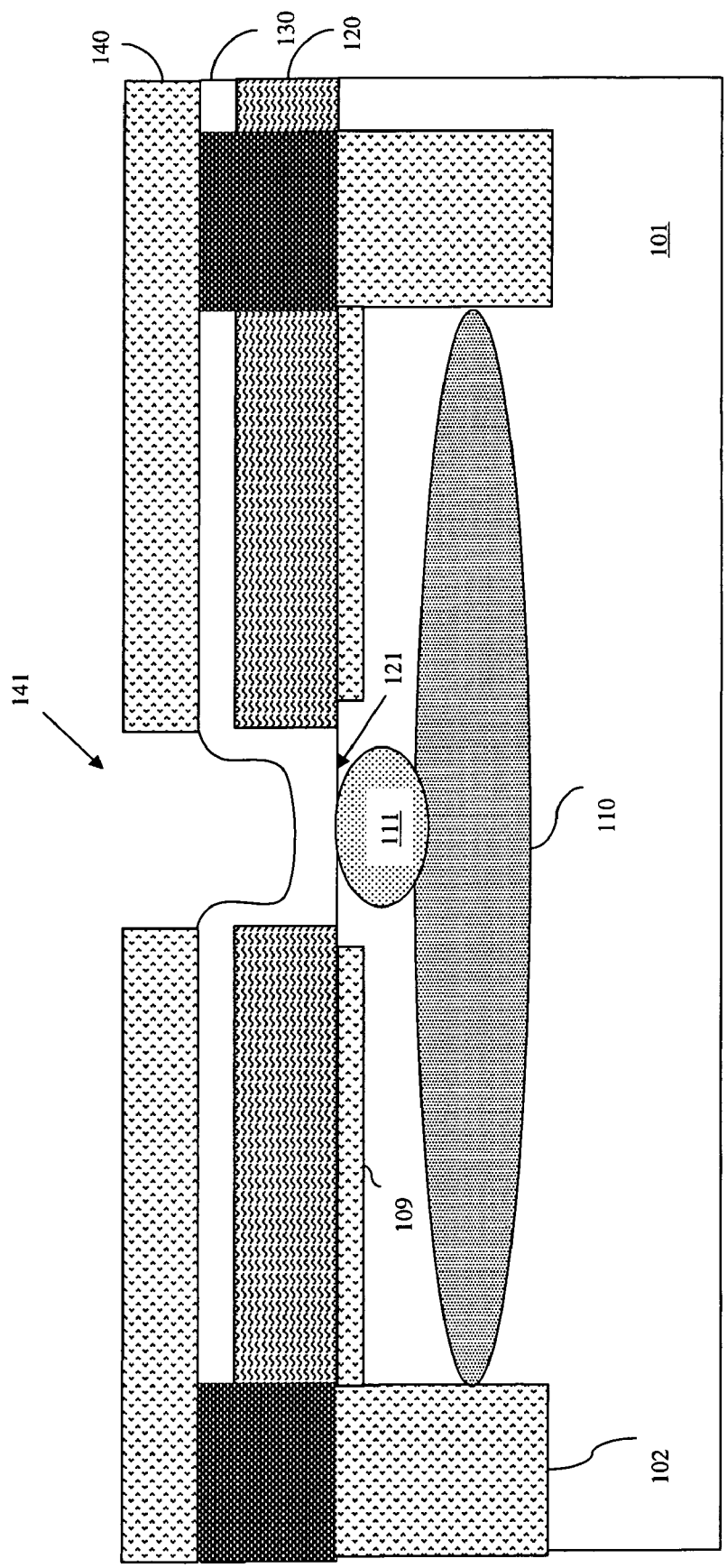
FIG. 11 is a cross-section diagram illustrating a partially completed HBT structure.
Figure 12:
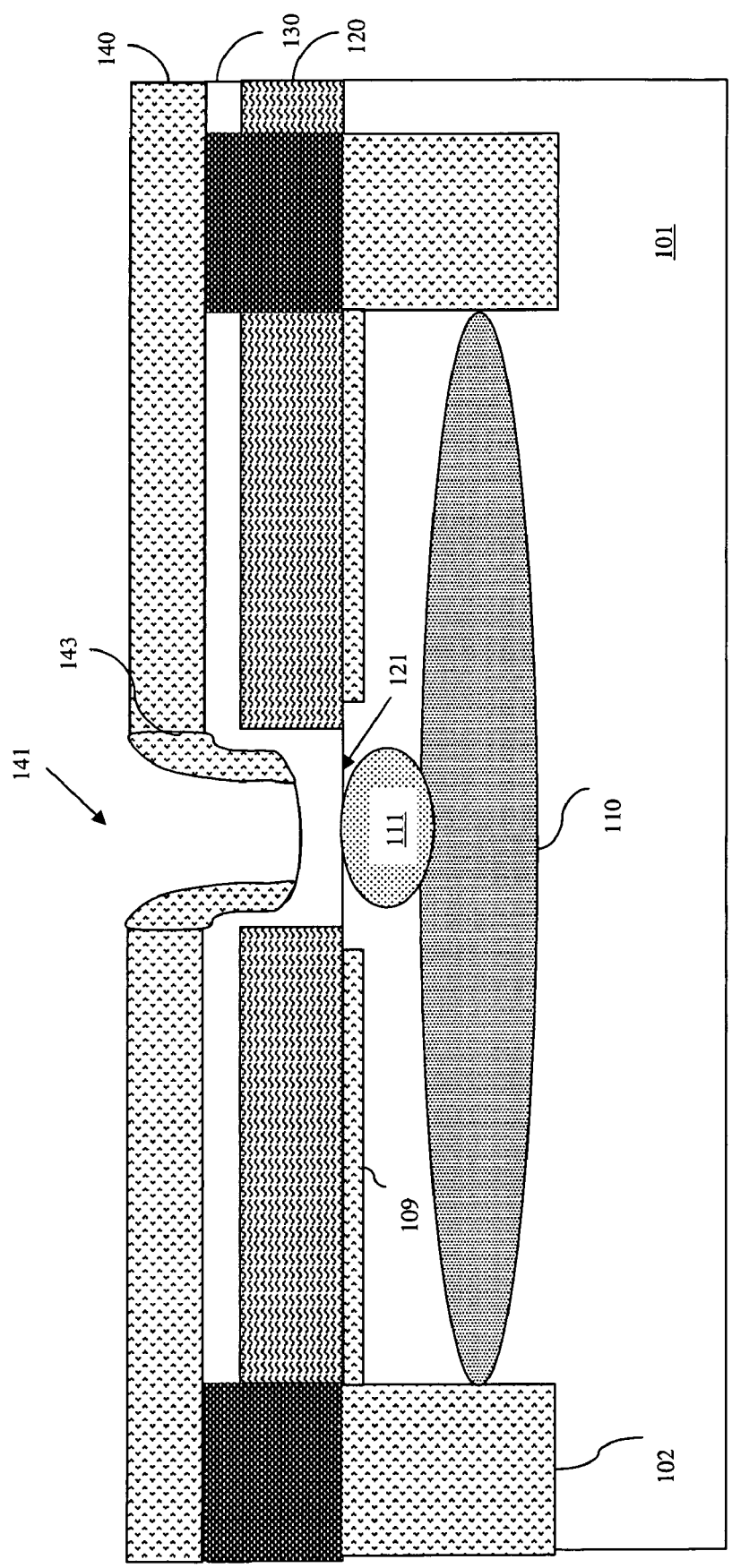
FIG. 12 is a cross-section diagram illustrating a partially completed HBT structure.

Next, a dielectric layer 140 can be formed on the intrinsic base layer 130 (214, see FIG. 10). For example, an oxide layer, a nitride layer or an oxide-nitride stack can be deposited and planarized to a predetermined thickness. Then, a second trench 141 can be formed (e.g., lithographically patterned and etched) through the dielectric layer 140 to the intrinsic base layer 130 such that the second trench 141 is aligned above the first trench 121 (216, see FIG. 11). Optionally, after the second trench 141 is formed and before a collector layer is subsequently formed at process 222 (see discussion below), sidewall spacers 143 (e.g., oxide or nitride sidewall spacers) can be formed in the first and second trenches 121/141 so as to cover the intrinsic base layer 130 such that, after the collector layer is subsequently formed, it is isolated from the intrinsic base layer 130 and, thereby isolated from the extrinsic base layer 120 (218, see FIG. 12).

Figure 13:
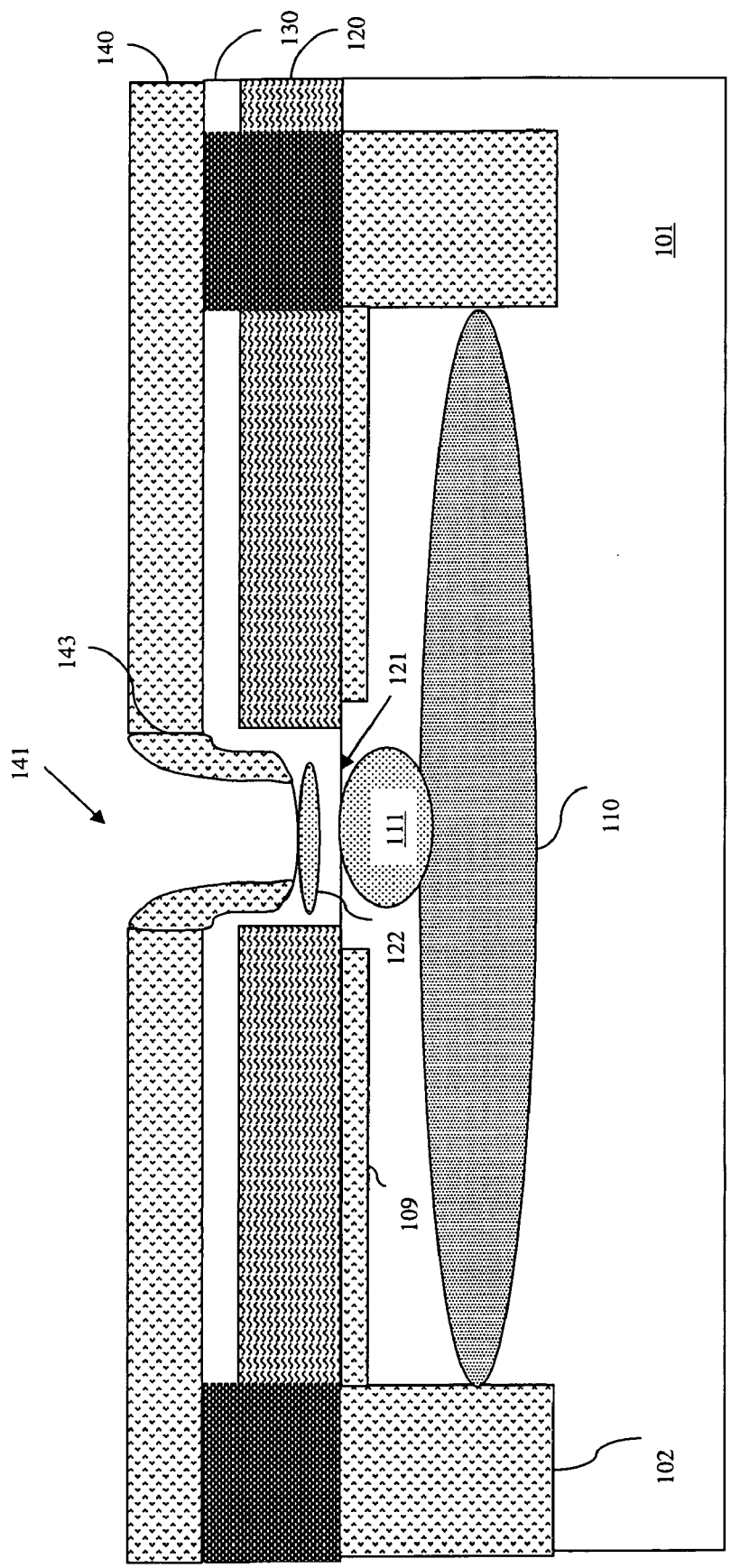
FIG. 13 is a cross-section diagram illustrating a partially completed HBT structure.

Also, optionally, after the second trench 141 and sidewall spacers 143 are formed and before a collector layer is subsequently formed at process 222 (see discussion below), an intrinsic base-to-collector link up region 122 can be formed (220, see FIG. 13). Specifically, a first type dopant (e.g., one or more N-type dopants, such as, phosphorous (P), arsenic (As), antimony (Sb), etc.) can be selectively implanted into an exposed portion of the intrinsic base layer 130 at the bottom surface of the first trench 121 so as to ensure the electrical connection between the intrinsic base layer 120 and a subsequently formed collector layer. However, this implantation process can be performed such that the concentration of the first type dopant in region 122 is less than that in the subsequently formed collector and optionally such that it is graded so as to minimize collector-to-base capacitance.

Figure 14:
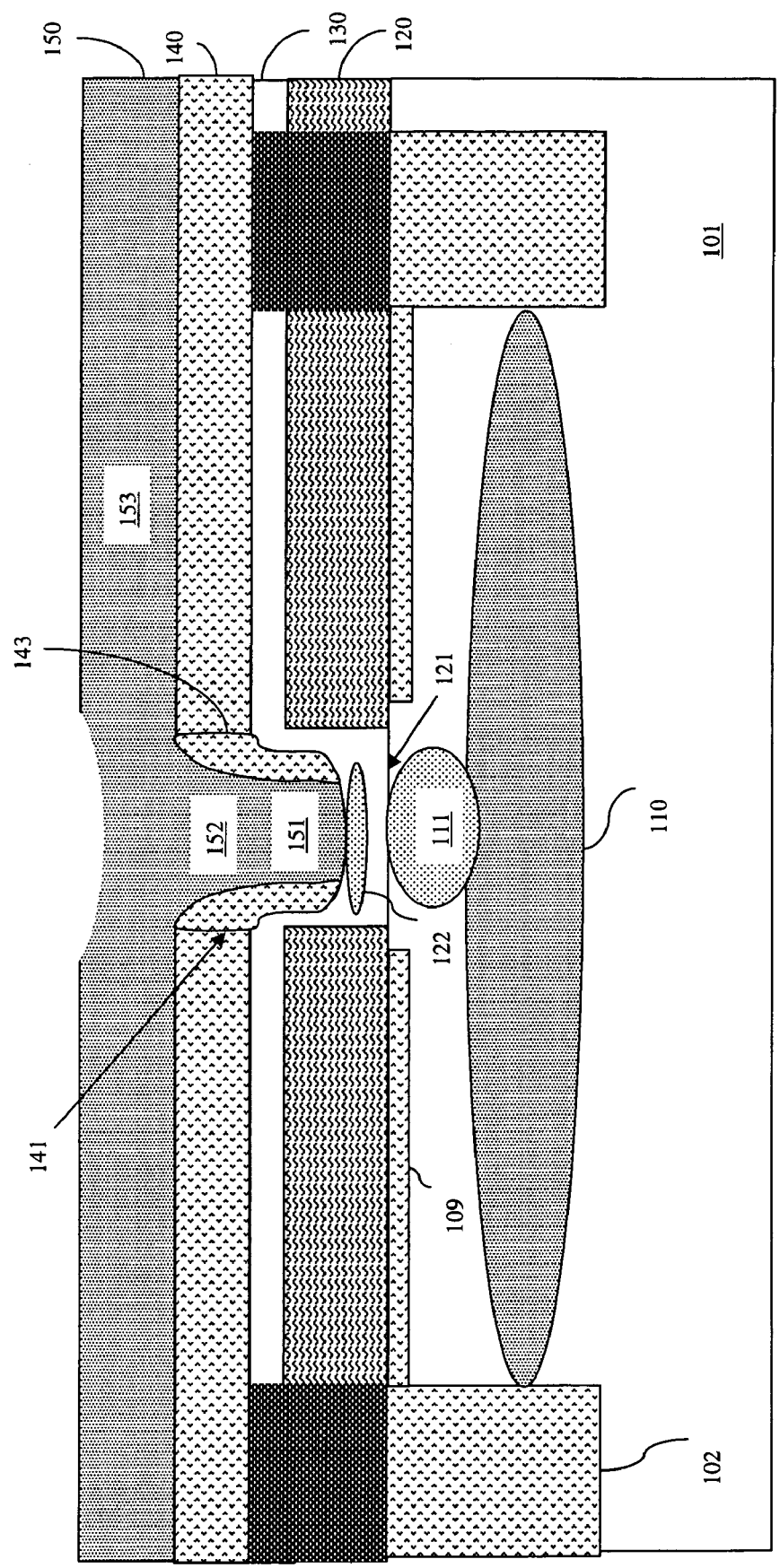
FIG. 14 is a cross-section diagram illustrating a partially completed HBT structure.

Next, a collector layer 150 is formed with a single crystalline lower portion 151 on the intrinsic base layer 130 in the first trench 121, with a mid-portion 152 on the lower portion 151 adjacent to the dielectric layer 140 (between optional sidewall spacers 143) within the second trench 141, and with a polycrystalline upper portion 153 on top of the dielectric layer 140 outside the second trench 141. The collector layer 150 is further formed such that it is heavily doped with a first type dopant (e.g., one or more N-type dopants, such as, phosphorous (P), arsenic (As), antimony (Sb), etc.) (222, see FIG. 14). To accomplish this, an epitaxial deposition process can be performed in which an epitaxial polycrystalline semiconductor material (e.g., polysilicon) is deposited onto the dielectric layer 140 and an epitaxial single crystalline semiconductor material (e.g., silicon) is deposited onto the exposed intrinsic base layer 130 within the trenches 121/141. During this epitaxial deposition process, the collector layer 150 can be in-situ doped with the first type dopant.

Figure 15:
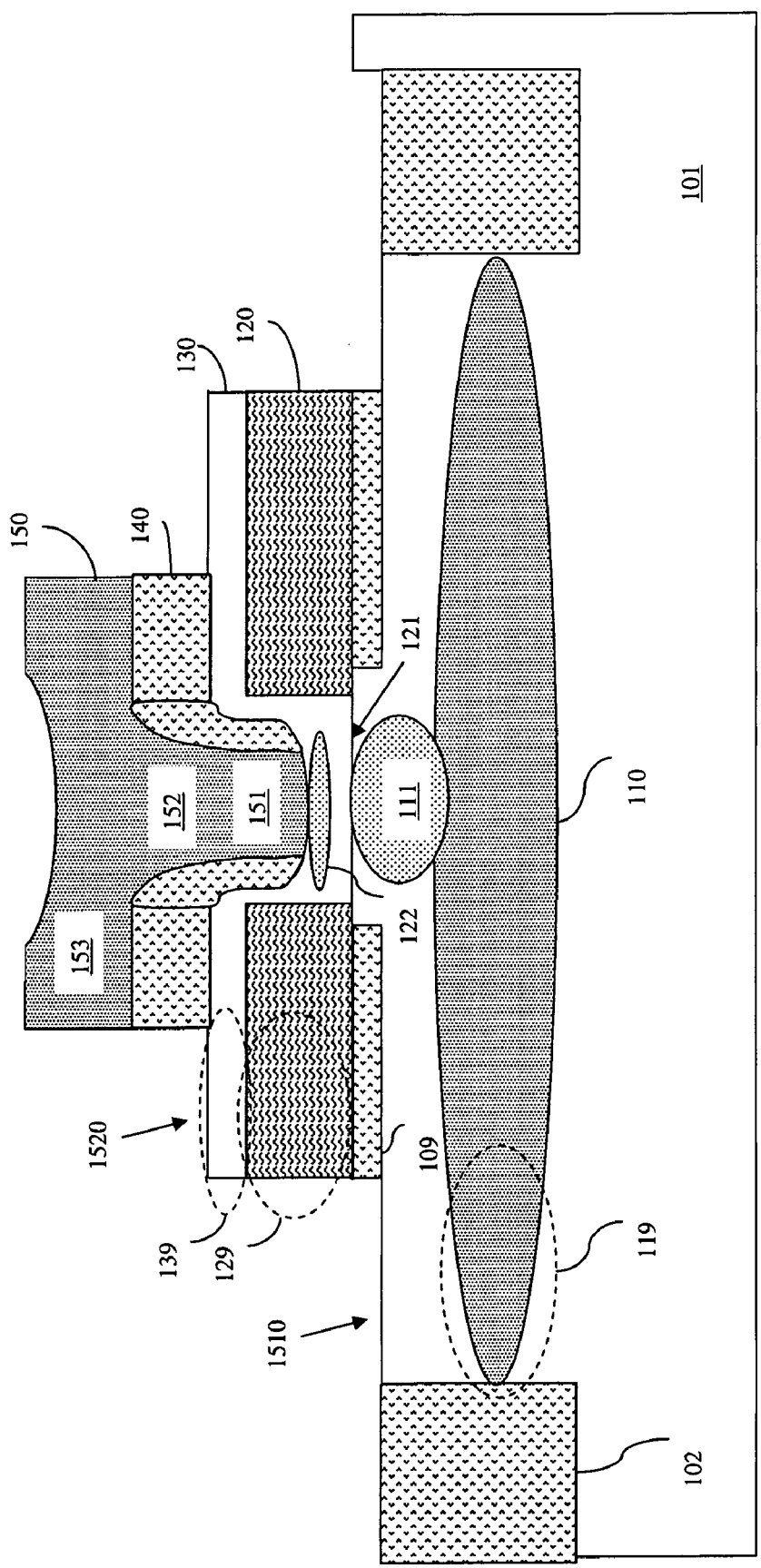
FIG. 15 is a cross-section diagram illustrating a partially completed HBT structure.

Once the collector layer is formed, the various layers discussed above can be lithographically patterned and etched to expose landing spots (i.e., landing areas) for component contacts (224, see FIG. 15). That is, the upper portion 153 of the collector layer 150 and the dielectric layer 140 can be lithographically patterned and etched such that the outer edges 139, 129 of the intrinsic and extrinsic base layers 130, 120 extend laterally beyond the upper portion 153 of the collector layer 150 and the dielectric layer 140 so as to provide landing spots 1520 for base contacts. Furthermore, the intrinsic and extrinsic base layers 120, 130 can be lithographically patterned and etched such that outer edges 119 of the emitter region 110 within the substrate 101 extend laterally beyond the base layers 120, 130 so as to provide landing spots 1510 for emitter contacts. It should be noted that if an optional SIMOX layer 109 was previously formed at process 208, discussed above, the portion of the SIMOX layer 109 adjacent to the STI regions 102 above the outer edges of the emitter region 110 must be selectively removed (e.g., by a directional reactive ion etch (RIE) process) so as to allow such contacts to be formed to emitter region 110. This selective removal process can be performed in conjunction with exposing the landing spots at process 224 (as illustrated) or during subsequent processing prior to emitter contact formation.

Figure 16:
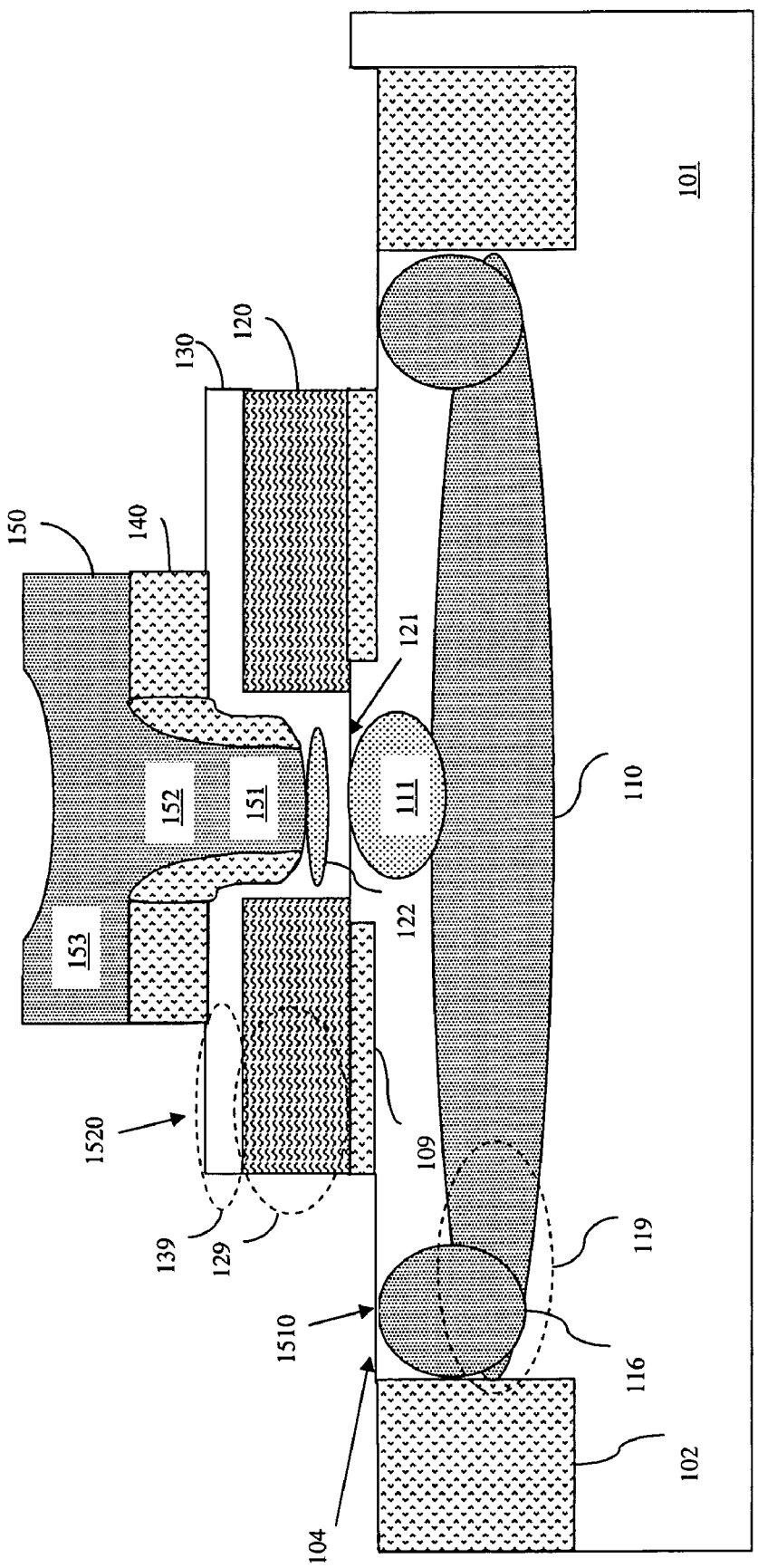
FIG. 16 is a cross-section diagram illustrating a partially completed HBT structure.

Additionally, before contacts are formed on the appropriate landing spots 1510, 1520, optional contact link-up regions can also be formed (226). For example, as illustrated in FIG. 16, a masked implantation process can be used to form emitter-to-emitter contact link-up regions 116 in the substrate 101 and, more specifically, to implant a first type dopant (e.g., one or more N-type dopants, such as, phosphorous (P), arsenic (As), antimony (Sb), etc.) into exposed portions of the substrate 101 at landing areas 1510 in order to form emitter-to-emitter contact link-up regions 116 extending vertically from the top surface 104 of the substrate 101 to the outer edges 119 of the emitter region 110. It should be noted that this masked implantation process can be performed either before formation of the extrinsic base layer 120 at process 206 of FIG. 2 or after patterning/etching of the intrinsic and extrinsic base layers to expose landing spots 1510 on the substrate 101 for the emitter contacts at process 224 of FIG. 2 (as shown).

Figure 17:
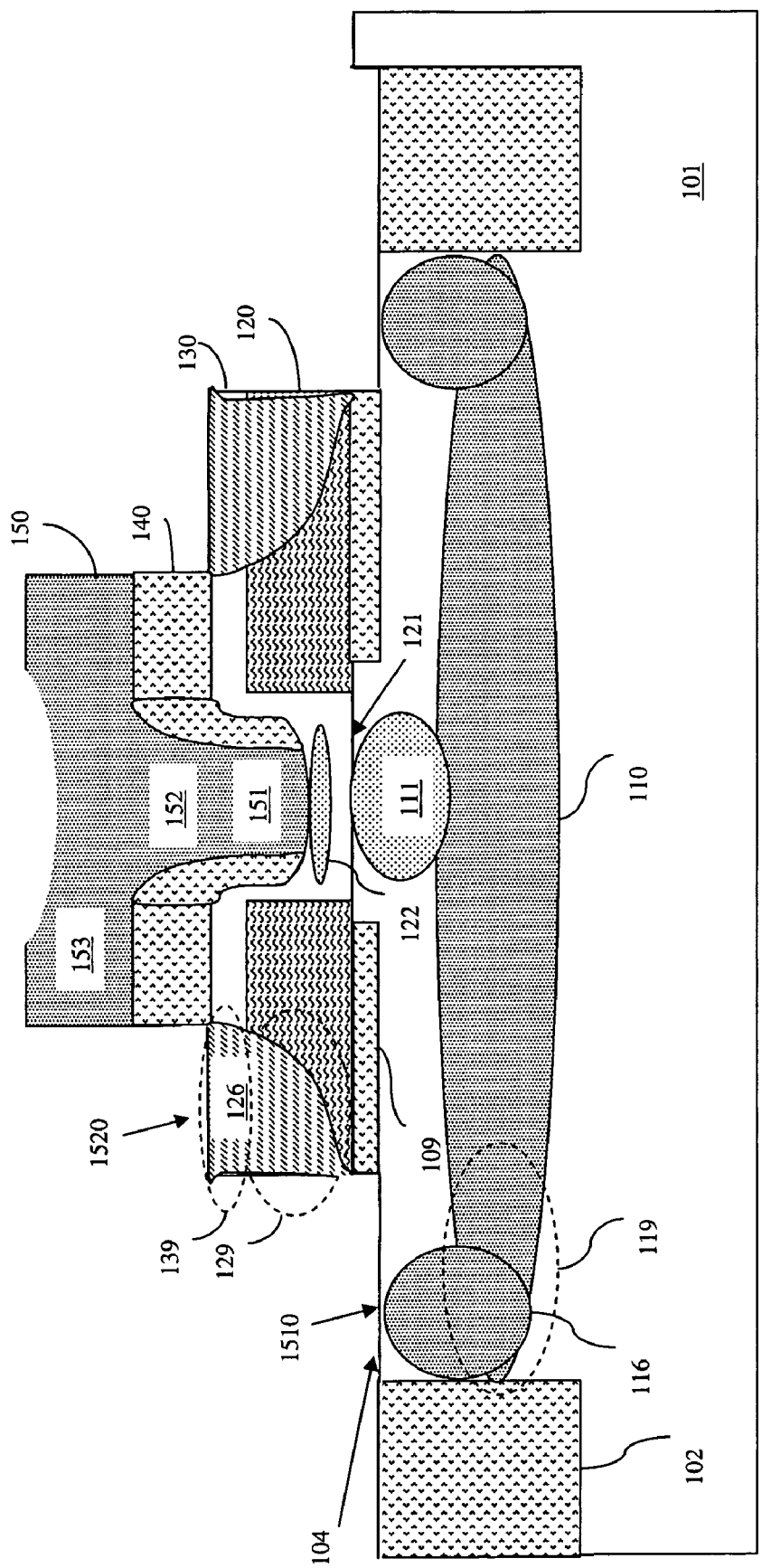
FIG. 17 is a cross-section diagram illustrating a partially completed HBT structure.

Additionally, as illustrated in FIG. 17, another masked implantation process can also be used to form extrinsic base-to-base contact link-up regions 126 in the outer edges 139 of the intrinsic base layer 130 and, more specifically, to implant a second type dopant (e.g., a P-type dopant, such as boron (B)) into the outer edges 139 of the intrinsic base layer 130 in order to form extrinsic base-to-base contact link-up regions 126 that extend vertically through the outer edges 139 of the intrinsic base layer 130 to the outer edges 129 of the extrinsic base layer 120. It should be noted that this implantation process can further be used to increase the dopant concentration within the outer edges 129 of the extrinsic base layer 120 and, thereby to further minimize base resistance. Optionally, after the intrinsic and extrinsic base layers 120, 120 are lithographically patterned and etched at process 224, additional dielectric sidewall spacers 123 (e.g., oxide or nitride sidewall spacers can be formed (e.g., using conventional processing techniques) on the substrate 101 adjacent to the intrinsic and extrinsic base layers 120, 130 so as to minimize capacitance between the extrinsic base layer 130 and subsequently formed emitter contacts and the optional emitter-to-emitter contact link-up regions 116 (228, see FIG. 1).

Next, additional process steps (e.g., formation of silicide regions, deposition of an additional dielectric layer 170, formation of contacts 118, 128, 138 to the emitter region 110, base region 120/130 and collector region 150 (respectively), etc.) can be performed in order to complete the HBT structure (230, see FIG. 1).

Therefore, disclosed above are embodiments of a heterojunction bipolar transistor (HBT) structure and method of forming the structure that provides substantially lower collector-to-base parasitic capacitance and collector resistance, while also lowering or maintaining base-to-emitter capacitance, emitter resistance and base resistance in order to achieve frequency capabilities in the THz range. Specifically, the disclosed HBT is a collector-up HBT in which a dielectric layer and optional sidewall spacers separate the raised extrinsic base and the collector so as to reduce collector-to-base capacitance. At least a lower portion of the collector is formed as a single crystalline structure so as to reduce collector resistance. The raised extrinsic base and the intrinsic base are formed as stacked single crystalline epitaxial layers, where link-up is automatic and self-aligned, so as to reduce base resistance. The emitter is formed as a heavily doped region of a single crystalline semiconductor substrate so as to reduce emitter resistance and is further formed below the top surface of the substrate (with an optional SIMOX layer separating the emitter from the extrinsic base layer) in order to reduce base-to-emitter capacitance. Finally, the disclosed HBT structure can include one or more optional appropriately doped link-up (i.e., reach-through) regions, including but not limited to, emitter-to-emitter contact link-up regions, an emitter-to-intrinsic base link-up region, an intrinsic base-to-collector link-up region, and extrinsic base-to-base contact link-up regions. Such a bipolar transistor may be integrated into a CMOS process flow with other integrated passive elements, such as, inductors, resistors, capacitors, diodes, etc., to make BiCMOS technology. Such BiCMOS technologies can cover applications in the radio frequency (RF) and millimeter (mm)-wave frequency ranges for building monolithic integrated circuits of, for example, transceivers, power amplifiers, imaging receivers, etc.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of embodiments, those skilled in the art will recognize that these embodiments can be practiced with modification within the spirit and scope of the appended claims.

What is claimed is:

1. A hetero-junction bipolar transistor structure comprising:
    a single crystalline semiconductor substrate having a top surface;
    an emitter region within said single crystalline semiconductor substrate below said top surface, said emitter region comprising a first type dopant;
    a single crystalline semiconductor extrinsic base layer on said single crystalline semiconductor substrate, said single crystalline semiconductor extrinsic base layer comprising a second type dopant;
    a first trench extending through said single crystalline semiconductor extrinsic base layer to said single crystalline semiconductor substrate and having a first sidewall and a bottom surface;
    a single crystalline semiconductor intrinsic base layer above said single crystalline semiconductor extrinsic base layer and further lining said first trench such that, within said first trench, a first portion of said single crystalline semiconductor intrinsic base layer is adjacent to said first sidewall and a second portion of said single crystalline semiconductor intrinsic base layer is adjacent to said bottom surface;
    a dielectric layer on said single crystalline semiconductor intrinsic base layer;
    a second trench extending through said dielectric layer to said single crystalline semiconductor intrinsic base layer, said second trench having a second sidewall approximately aligned above said first sidewall;
    a sidewall spacer within said second trench positioned laterally adjacent to said second sidewall and within said first trench positioned laterally adjacent to said first portion of said single crystalline semiconductor intrinsic base layer; and
    a collector layer comprising said first type dopant and having a single crystalline semiconductor lower portion, a mid-portion and a polycrystalline semiconductor upper portion,
        said single crystalline semiconductor lower portion of said collector layer being within said first trench on said second portion of said single crystalline semiconductor intrinsic base layer and positioned laterally adjacent to said sidewall spacer,
        said mid-portion of said collector layer being within said second trench above said lower portion and positioned laterally adjacent to said sidewall spacer, and
        said polycrystalline semiconductor upper portion being above said mid-portion and extending horizontally onto said dielectric layer.

2. The structure according to claim 1,
    said emitter region within said single crystalline semiconductor substrate extending laterally beyond said single crystalline semiconductor extrinsic base layer and said single crystalline semiconductor intrinsic base layer, and
    said structure further comprising:
    an emitter contact on said single crystalline semiconductor substrate positioned laterally adjacent to and electrically isolated from said single crystalline semiconductor extrinsic base layer and said single crystalline semiconductor intrinsic base layer; and
    an emitter-to-emitter contact link-up region in said single crystalline semiconductor substrate extending vertically from said emitter contact to an outer edge of said emitter region, said emitter-to-emitter contact link-up region comprising said first type dopant.

3. The structure of claim 2, further comprising an additional sidewall spacer on said single crystalline semiconductor substrate positioned laterally adjacent to said single crystalline semiconductor extrinsic base layer such that said emitter contact and said emitter-to-emitter contact link-up region are electrically isolated from said single crystalline semiconductor extrinsic base layer.

4. The structure of claim 1,
    said single crystalline semiconductor intrinsic base layer and said single crystalline semiconductor extrinsic base layer each extending laterally beyond said upper portion of said collector layer and said dielectric layer, and
    said structure further comprising:
    a base contact on said single crystalline semiconductor intrinsic base layer and positioned laterally adjacent said dielectric layer and said polycrystalline semiconductor upper portion of said collector layer; and
    an extrinsic base-to-base contact link-up region in said single crystalline semiconductor intrinsic base layer extending between an outer edge of said single crystalline semiconductor extrinsic base layer and said base contact, said extrinsic base-to-base contact link-up region comprising said second type dopant.

5. The structure of claim 1, further comprising an emitter-to-intrinsic base link-up region in said single crystalline semiconductor substrate extending vertically between said emitter region and said bottom surface of said first trench, said emitter-to-intrinsic base link-up region comprising said first type dopant at a lesser concentration than in said emitter region.

6. The structure of claim 1, further comprising an intrinsic base-to-collector link-up region in said second portion of said single crystalline semiconductor intrinsic base layer, said intrinsic base-to-collector link-up region comprising said first type dopant at a lesser concentration than in said collector region.

7. The structure of claim 1, further comprising a separation by implantation of oxygen (SIMOX) layer in said single crystalline semiconductor substrate between said single crystalline semiconductor extrinsic base layer and said emitter region, wherein said SIMOX layer does not extend below said first trench.

8. A hetero-junction bipolar transistor structure comprising:
- a single crystalline semiconductor substrate having a top surface;
- an emitter region within said single crystalline semiconductor substrate below said top surface, said emitter region comprising a first type dopant at a first concentration;
- a single crystalline semiconductor extrinsic base layer on said single crystalline semiconductor substrate, said single crystalline semiconductor extrinsic base layer comprising a second type dopant;
- a first trench extending through said single crystalline semiconductor extrinsic base layer to said single crystalline semiconductor substrate and having a first sidewall and a bottom surface;
- a single crystalline semiconductor intrinsic base layer above said single crystalline semiconductor extrinsic base layer and further lining said first trench such that, within said first trench, a first portion of said single crystalline semiconductor intrinsic base layer is adjacent to said first sidewall and a second portion of said single crystalline semiconductor intrinsic base layer is adjacent to said bottom surface;
- an emitter-to-intrinsic base link-up region in said single crystalline semiconductor substrate extending vertically between said emitter region and said bottom surface of said first trench, said emitter-to-intrinsic base link-up region comprising said first type dopant at a second concentration that is less than said first concentration;
- a dielectric layer on said single crystalline semiconductor intrinsic base layer;
- a second trench extending through said dielectric layer to said single crystalline semiconductor intrinsic base layer, said second trench having a second sidewall approximately aligned above said first sidewall;
- a sidewall spacer within said second trench positioned laterally adjacent to said second sidewall and within said first trench positioned laterally adjacent to said first portion of said single crystalline semiconductor intrinsic base layer; and
- a collector layer comprising said first type dopant and having a single crystalline semiconductor lower portion, a mid-portion and a polycrystalline semiconductor upper portion,
  - said single crystalline semiconductor lower portion of said collector layer being within said first trench on said second portion of said single crystalline semiconductor intrinsic base layer and positioned laterally adjacent to said sidewall spacer,
  - said mid-portion of said collector layer being within said second trench above said lower portion and positioned laterally adjacent to said sidewall spacer, and
  - said polycrystalline semiconductor upper portion being above said mid-portion and extending horizontally onto said dielectric layer.

9. The structure according to claim 8,
said emitter region within said single crystalline semiconductor substrate extending laterally beyond said single crystalline semiconductor extrinsic base layer and said single crystalline semiconductor intrinsic base layer, and
said structure further comprising:
- an emitter contact on said single crystalline semiconductor substrate positioned laterally adjacent to and electrically isolated from said single crystalline semiconductor extrinsic base layer and said single crystalline semiconductor intrinsic base layer; and
- an emitter-to-emitter contact link-up region in said single crystalline semiconductor substrate extending vertically from said emitter contact to an outer edge of said emitter region, said emitter-to-emitter contact link-up region comprising said first type dopant.

10. The structure of claim 9, further comprising an additional sidewall spacer on said single crystalline semiconductor substrate positioned laterally adjacent to said single crystalline semiconductor extrinsic base layer such that said emitter contact and said emitter-to-emitter contact link-up region are electrically isolated from said single crystalline semiconductor extrinsic base layer.

11. The structure of claim 8,
said single crystalline semiconductor intrinsic base layer and said single crystalline semiconductor extrinsic base layer each extending laterally beyond said polycrystalline semiconductor upper portion of said collector layer and said dielectric layer, and
said hetero-junction bipolar transistor structure further comprising:
- a base contact on said single crystalline semiconductor intrinsic base layer and positioned laterally adjacent said dielectric layer and said polycrystalline semiconductor upper portion of said collector layer; and
- an extrinsic base-to-base contact link-up region in said single crystalline semiconductor intrinsic base layer extending between an outer edge of said single crystalline semiconductor extrinsic base layer and said base contact, said extrinsic base-to-base contact link-up region comprising said second type dopant.

12. The structure of claim 8, said collector layer comprising said first type dopant in a third concentration and said hetero-junction bipolar transistor structure further comprising an intrinsic base-to-collector link-up region in said second portion of said single crystalline semiconductor intrinsic base layer, said intrinsic base-to-collector link-up region comprising said first type dopant in a fourth concentration that is less than said third concentration.

13. The structure of claim 8, further comprising a separation by implantation of oxygen (SIMOX) layer in said single crystalline semiconductor substrate between said single crystalline semiconductor extrinsic base layer and said emitter region, wherein said SIMOX layer does not extend below said first trench.

14. The structure of claim 8, said second concentration of said first type dopant in said emitter-to-intrinsic base link-up region being graded so as to minimize base-to-emitter capacitance.

15. The structure of claim 12, said fourth concentration of said first type dopant in said intrinsic base-to-collector link-up region being graded so as to minimize collector-to-base capacitance.

16. A hetero-junction bipolar transistor structure comprising:
- a single crystalline silicon substrate having a top surface;
- an emitter region within said single crystalline silicon substrate below said top surface, said emitter region comprising a first type dopant;
- a single crystalline silicon extrinsic base layer on said single crystalline silicon substrate, said single crystalline silicon extrinsic base layer comprising a second type dopant;

a first trench extending through said single crystalline silicon extrinsic base layer to said single crystalline silicon substrate and having a first sidewall and a bottom surface;

a separation by implantation of oxygen (SIMOX) layer in said single crystalline silicon substrate between said single crystalline silicon extrinsic base layer and said emitter region, wherein said SIMOX layer does not extend below said first trench, a single crystalline silicon germanium intrinsic base layer above said single crystalline silicon extrinsic base layer and further lining said first trench such that, within said first trench, a first portion of said single crystalline silicon germanium intrinsic base layer is adjacent to said first sidewall and a second portion of said single crystalline silicon germanium intrinsic base layer is adjacent to said bottom surface;

a dielectric layer on said single crystalline silicon germanium intrinsic base layer;

a second trench extending through said dielectric layer to said single crystalline silicon germanium intrinsic base layer, said second trench having a second sidewall approximately aligned above said first sidewall;

a sidewall spacer within said second trench positioned laterally adjacent to said second sidewall and within said first trench positioned laterally adjacent to said first portion of said single crystalline silicon germanium intrinsic base layer; and a collector layer comprising said first type dopant and having a single crystalline silicon lower portion, a mid-portion and a polysilicon upper portion, said single crystalline silicon lower portion of said collector layer being within said first trench on said second portion of said single crystalline silicon germanium intrinsic base layer and positioned laterally adjacent to said sidewall spacer, said mid-portion of said collector layer being within said second trench above said lower portion and positioned laterally adjacent to said sidewall spacer, and said polysilicon upper portion being above said mid-portion and extending horizontally onto said dielectric layer.

17. The structure according to claim 16, said emitter region within said single crystalline silicon substrate extending laterally beyond said single crystalline silicon extrinsic base layer and said single crystalline silicon germanium intrinsic base layer, and said hetero-junction bipolar transistor structure further comprising:

an emitter contact on said single crystalline silicon substrate positioned laterally adjacent to and electrically isolated from said single crystalline silicon extrinsic base layer and said single crystalline silicon germanium intrinsic base layer; and an emitter-to-emitter contact link-up region in said single crystalline silicon substrate extending vertically from said emitter contact to an outer edge of said emitter region, said emitter-to-emitter contact link-up region comprising said first type dopant.

18. The structure of claim 16, said single crystalline silicon germanium intrinsic base layer and said single crystalline silicon extrinsic base layer each extending laterally beyond said polysilicon upper portion of said collector layer and said dielectric layer, and said hetero-junction bipolar transistor structure further comprising:

a base contact on said single crystalline silicon germanium intrinsic base layer and positioned laterally adjacent said dielectric layer and said polysilicon upper portion of said collector layer; and an extrinsic base-to-base contact link-up region in said single crystalline silicon germanium intrinsic base layer extending between an outer edge of said single crystalline silicon extrinsic base layer and said base contact, said extrinsic base-to-base contact link-up region comprising said second type dopant.

19. The structure of claim 16, further comprising:

an emitter-to-intrinsic base link-up region in said single crystalline silicon substrate extending vertically between said emitter region and said bottom surface of said first trench, said emitter-to-intrinsic base link-up region comprising said first type dopant at a lesser concentration than in said emitter region; and an intrinsic base-to-collector link-up region in said second portion of said single crystalline silicon germanium intrinsic base layer, said intrinsic base-to-collector link-up region comprising said first type dopant in a lesser concentration than in said collector layer.

* * * * *